(12) United States Patent
Miulli et al.

(10) Patent No.: US 12,029,020 B2
(45) Date of Patent: Jul. 2, 2024

(54) MULTI-LAYER SYSTEM FOR SHIELDING FROM ELECTROMAGNETIC FIELDS

(71) Applicants: Dan Miulli, Riverside, CA (US); James Garvin Wiginton, IV, Riverside, CA (US); James Brazdzionis, Redlands, CA (US); Paras Savla, Riverside, CA (US)

(72) Inventors: Dan Miulli, Riverside, CA (US); James Garvin Wiginton, IV, Riverside, CA (US); James Brazdzionis, Redlands, CA (US); Paras Savla, Riverside, CA (US)

(*) Notice: Subject to any disclaimer, the term of this patent is extended or adjusted under 35 U.S.C. 154(b) by 0 days.

(21) Appl. No.: 18/321,096

(22) Filed: May 22, 2023

(65) Prior Publication Data
US 2023/0380123 A1     Nov. 23, 2023

Related U.S. Application Data

(60) Provisional application No. 63/365,094, filed on May 20, 2022.

(51) Int. Cl.
*H05K 9/00* (2006.01)
*G01R 29/08* (2006.01)

(52) U.S. Cl.
CPC .......... *H05K 9/0088* (2013.01); *H05K 9/009* (2013.01); *G01R 29/0878* (2013.01)

(58) Field of Classification Search
CPC .................................................... H05K 9/0088
See application file for complete search history.

(56) References Cited

U.S. PATENT DOCUMENTS

| 11,729,958 B1* | 8/2023 | Sanders | H05K 9/0064 |
| | | | 174/350 |
| 2015/0271911 A1* | 9/2015 | Chen | H05K 1/0216 |
| | | | 29/841 |

FOREIGN PATENT DOCUMENTS

| KR | 200342235 | * 2/2004 | G12B 17/02 |

OTHER PUBLICATIONS

Electro-Magnetic Field Shielded cabinet with Ferrite Powder (Year: 2004).*

* cited by examiner

*Primary Examiner* — Hung V Ngo
(74) *Attorney, Agent, or Firm* — Dunlap Bennett & Ludwig, PLLC

(57) ABSTRACT

A multilayer electromagnetic shielding system providing two stacks spaced apart by an air gap, wherein each stack has an electric-field-attenuating layer adhered to a magnetic-field-attenuating layer. An electromagnetically inert material may sandwich the spaced apart stacks for insulative and structural purposes.

8 Claims, 2 Drawing Sheets

MULTI-LAYER SYSTEM FOR SHIELDING FROM ELECTROMAGNETIC FIELDS

CROSS-REFERENCE TO RELATED APPLICATION

This application claims the benefit of priority of U.S. provisional application No. 63/365,094, filed May 20, 2022, the contents of each are herein incorporated by reference.

BACKGROUND OF THE INVENTION

The present invention relates to electromagnetic fields and, more particularly, to a multi-layer system for shielding from electromagnetic fields.

Electromagnetic fields are generated by a variety of structures and sources. For example, in neurosciences, neurons generate an electrochemical gradient and transmit signals to other local neurons. These neurons simultaneously fire in a summative fashion to generate an electromagnetic field. This electromagnetic field has been measured through a variety of sensor modalities which may involve super conducting quantum interference devices (SQUIDs), optically pumped magnetometers (OPM), or induction sensors. These sensors have been utilized in devices for magnetoencephalography which act as an imaging modality in neural sciences. These devices all rely on shielding to exclude higher strength electromagnetic fields which may mask the smaller strength, target magnetic field generated by the brain.

Electromagnetic field sensors have numerous applications including within the healthcare field. Neuroimaging modalities such as magnetoencephalography and electroencephalography represent examples of such technology. Regardless of the mechanism of the individual sensors, these electromagnetic field sensors may receive interference from external sources of electromagnetic signals that are not the target areas of interest.

Research has been ongoing to evaluate effective shielding modalities to prevent external interference. Commonly large, shielded rooms are required, or complex liquid-cooled devices are developed. These techniques have high costs of manufacturing and space requirements that limit their usage. Further the space utilized for these shielded rooms is generally then allocated for the shielded room and electromagnetic field measuring devices which limits usage of the space for other purposes, which in turn may prohibit their use within hospitals and research settings where space is a premium.

Further, as these spaces are created in a fixed location, there are limits to portability which may limit access for large segments of the population. Even when these shielding technologies are constructed in a smaller size, they may be heavy which additionally limits portability and usage beyond its intrinsic location.

Therefore, there exists a need for improvements in shielding technologies that may be condensed to smaller sizes, have increased portability, and be lightweight to aid in further applications to optimize usage of electromagnetic field sensors in a variety of settings.

SUMMARY OF THE INVENTION

In one aspect of the present invention, a multilayer electromagnetic field shield system, the system provides two electromagnetic shield stacks spaced apart by an airgap, wherein each electromagnetic shield stack comprises an electric field attenuator layer adhered to a magnetic field attenuator layer, wherein air gap is directly bounded by a respective magnetic field attenuator layer of the two electromagnetic shield stacks.

In another aspect of the present invention, the system further provides wherein each electromagnetic shield stack further comprises an outermost electromagnetically inert layer, wherein each electromagnetic shield stack further comprises an innermost electromagnetically inert layer, wherein the electric field attenuator layers comprise a copper mesh, wherein the magnetic field attenuator layers comprise a MU-metal, wherein the airgap is approximately one-half of an inch between its bounds of the respective magnetic field attenuator layers, wherein the electromagnetically inert layers are plastic, wherein the magnetic field attenuator layers have a thickness of approximately 0.014 of an inch, wherein the electric field attenuator layers have a thickness of approximately 0.25 of an inch, and wherein the outermost electromagnetically inert layer defines an outer surface of a shell with radially protruding channels.

These and other features, aspects and advantages of the present invention will become better understood with reference to the following drawings, description, and claims.

DETAILED DESCRIPTION OF THE INVENTION

Figure 1:
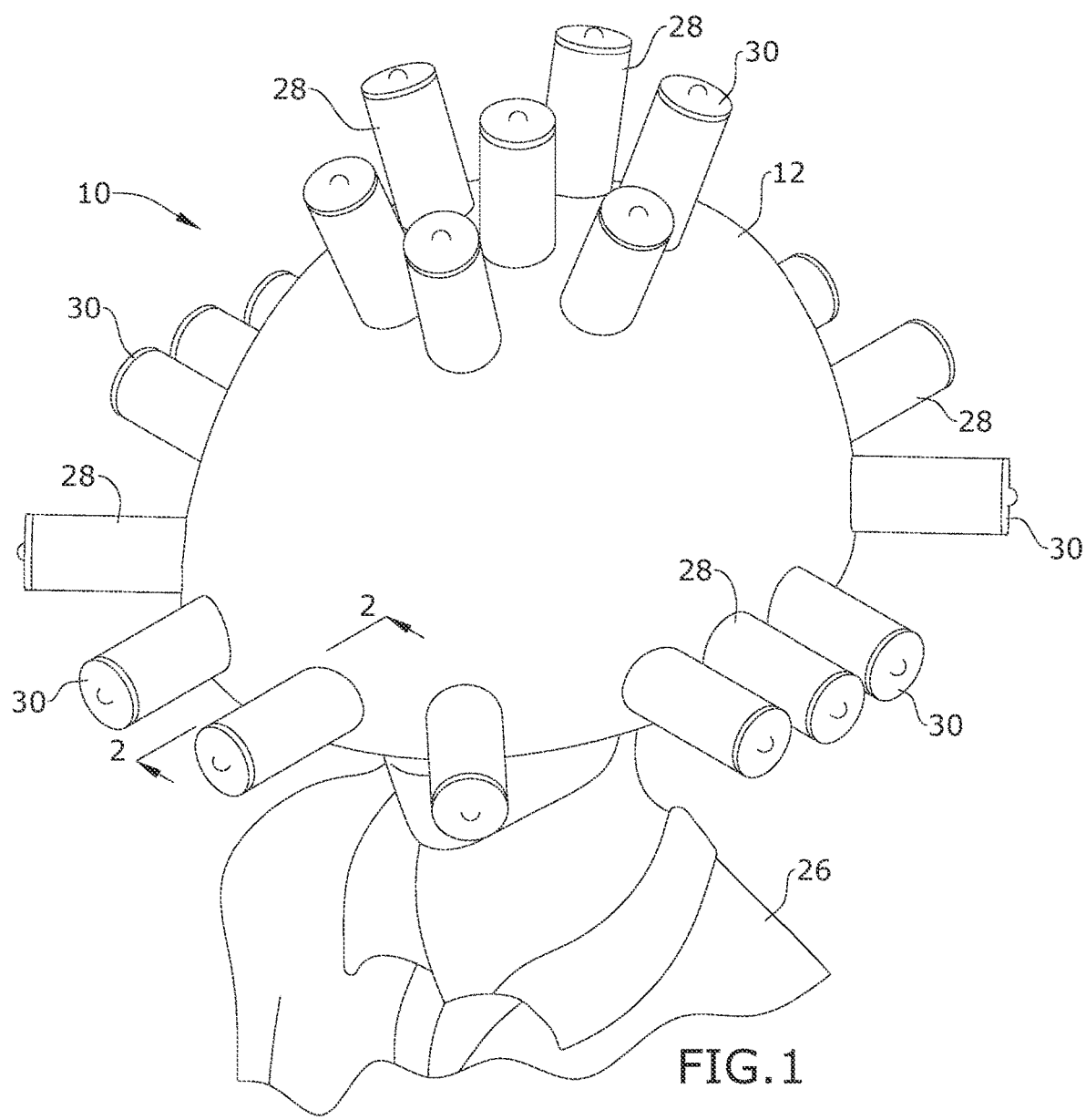
FIG. 1 is a perspective view of an exemplary embodiment of the present invention, shown in use.

The following detailed description is of the best currently contemplated modes of carrying out exemplary embodiments of the invention. The description is not to be taken in a limiting sense but is made merely for the purpose of illustrating the general principles of the invention, since the scope of the invention is best defined by the appended claims.

Broadly, an embodiment of the present invention provides a device employing a multilayer shield system to shield a space used to measure a target electromagnetic field. The multilayer shield system embodies two electromagnetic-attenuating sandwiches spaced apart by an air gap, wherein each sandwich includes an electric-field-attenuating material adhered to a magnetic-field-attenuating material. The electric-field-attenuating material may include an interlaced copper mesh or the like. The magnetic-field-attenuating material may include a nickel-iron soft ferromagnetic alloy, such as Mu-Metal®, or the like. The multilayer shield system has been found by the inventors to effectively shield the space used for electromagnetic measurement with induction sensors. This is due to the unique use of multiple material types and a specific method of layering.

The present invention's dual layer shielding modality may eliminate a need for larger shielding technologies such as shielded rooms. Therefore, the present invention increases the portability, size, and types of modalities of the shielding for use in targeted area of interest; for instance, this dual layer system allows for usage as a liner to line devices for appropriate shielding.

The layering of the present invention may allow for usage as a liner within an object for these sensors to be utilized to evaluate selected electromagnetic fields in multiple settings including for purposes like magnetoencephalography which may measure the human electromagnetic field generated by the brain for clinical purposes.

The device of the present invention may be relatively small, lightweight, and inexpensive compared to the need for a magnetically shielded room or other large magnetic shield device. This provides portability and cost-savings. It may not require cooling or a source of power.

The multilayer design may allow for usage of thinner materials, fewer materials, and effectively absorbs and reflects the electromagnetic field. It additionally may enable the shielding to be reduced to targeted regions of interest with usage as a liner to measure a selected subject using electromagnetic field sensors.

The description herein repeatedly refers to Mu-Metal®. It is noted that the present invention is not particularly limited to Mu-Metal®. When Mu-Metal® is discussed, any proper substitute may be utilized.

The present invention's layered design provides a structural component to block external electromagnetic fields from sensors within or passing through the layered design. This multilayer design has been demonstrated to effectively exclude external electromagnetic field noise and allow for appropriate measurements of a generated electromagnetic field created by the brain in human subjects participating in multiple activities. This layered design may also allow for appropriate measurement of other targeted subjects (inorganic or organic, other than humans) shielded spaced apart dual layer configuration embodied in the present invention, thereby the present invention effectively excludes the external electromagnetic field that is not intended to be measured. In some embodiments, an air gap may be added as an electromagnetic field insulation between two sets or two electromagnetic-attenuating sandwiches spaced apart by an air gap, wherein each sandwich includes an electric-field-attenuating material adhered to a magnetic-field-attenuating material: in some embodiments, a copper mesh layer and a Mu-Metal® layer, respectively. The Mu-Metal® attenuates the magnetic field, and the copper mesh layers attenuates the electric field.

This multi-layered system may be employed, for example, in the form of a helmet or as a liner for a device to allow for the shielding of extrinsic electromagnetic field while allowing for an induction sensor to record the intrinsic electromagnetic field of a human brain or to measure the electromagnetic field of a designated object or subject.

Figure 2:
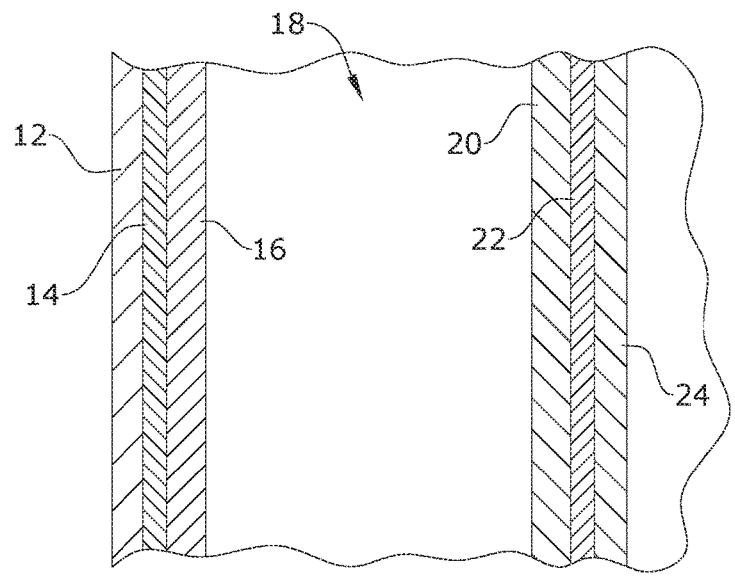
FIG. 2 is a section view of an exemplary embodiment of the present invention, taken along line 2-2 in FIG. 1.
Figure 3:
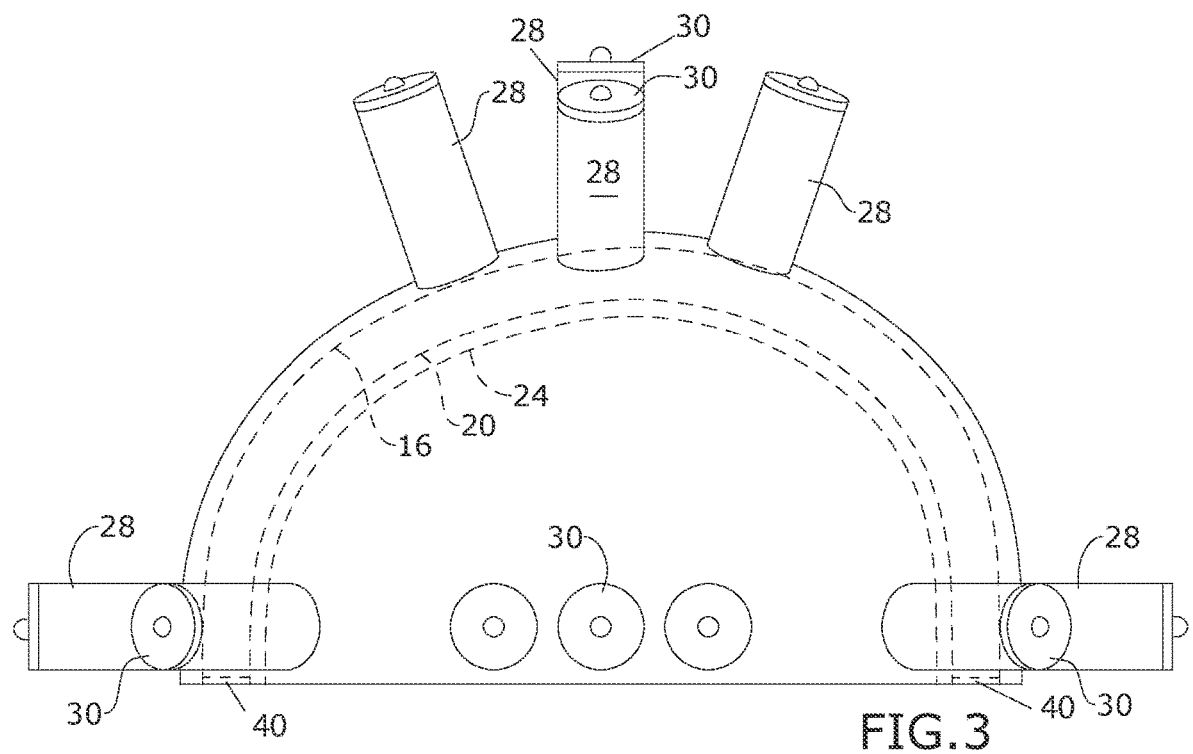
FIG. 3 is a side elevation of an exemplary embodiment of the present invention, wherein the interior layers are shown in dashed lines.

Referring now to FIGS. 1 through 3, FIG. 2 is a cross-sectional view of the multi-layer system according to an embodiment of the present invention.

The electric-field-attenuating material layers 14, 22 and the magnetic-field-attenuating material layers 16, 20 are necessary and critical for the function of the present invention. An air gap 18 is also critical to provide a necessary buffer between the magnetic-field-attenuating material layers 16, 20. Electromagnetically inert layers 12 and 24 provide a structure for the electric-field-attenuating material layers 14, 22 and magnetic-field-attenuating material layers 16, 20, though the specifics of electromagnetically inert material (type and thickness) are not critical to the function. The electromagnetically inert material may be various plasticized material or other materials as long as they do not receive or modify an electromagnetic field sensor. The external magnetic-field-attenuating material layer 16 provides structural integrity to the layers to preserve the air gap 18 and provides scaffolding to the layered structure.

The outer electromagnetically inert material layer 12 protects the inner components from the surface of the subject 26 being studied. It also provides a framework for the outer electric-field-attenuating material layer 14 to fit between the electromagnetically inert material layer 12 and the outer magnetic-field-attenuating material layer 16. The outer electromagnetically inert material layer 12 measures approximately 0.25 inches, while the potential space for the electromagnetically inert material layer 12 measures approximately 0.25 inches. The electromagnetically inert material layer 12 lies between the outer electromagnetically inert material layer 12 and the outer electric-field-attenuating material layer 14. The outer magnetic-field-attenuating material layer 16 may be approximately 0.014 inches and lies between the outer electric-field-attenuating material layer 14 the air gap 18. The air gap is approximately 0.5 inches.

The second set or electromagnetically attenuating sandwich, or inner sandwich, includes the inner magnetic-field-attenuating material layer 20 is disposed between the air gap 18 and the inner electric-field-attenuating material layer 22. The inner magnetic-field-attenuating material layer 20 measures approximately 0.014 inches, and the inner electric-field-attenuating material layer 22 measures approximately 0.25 inches. An inner electromagnetically inert material layer 24 may be adhered to the inner electric-field-attenuating material layer 22 to provide structural integrity. These box-like forms may be placed next to each other to form a sheet.

In some embodiments, the inner plastic layer 24 is molded to the desired size and shape. The interlaced copper mesh layer 22 is laid on top of the inner plastic layer 24 in the same shape as the inner plastic layer 24. The interlaced copper layers 14 and 22 may both be approximately 0.25 inches thick. The outer Mu-Metal® layer 16 may be molded to the same shape as the to create a layer on top of the inner plastic layer. A proportionally sized inner Mu-Metal® layer 20 may be formed allowing for layering on top of the inner Mu-Metal® layer 20 while leaving a space of 0.5 inches to provide the air gap 18. A layer of interlaced copper mesh to form the outer layer of interlaced copper mesh 22 may be layered over the inner Mu-Metal® layer 20.

An external magnetic-field-attenuating material (Mu-Metal®) layer 40 measuring 0.014 inches in thickness may span and be bonded to the inner and outer Mu-Metal® layers 16, 20 to preserve structural integrity and maintain and fence off the air gap 18. This external Mu-Metal® layer 40 may be placed on the sides of the layered sheets to form the edges of a box of a desired shape leaving the inner plastic layer 12 as the internal but exposed layer on the bottom and the external Mu-Metal® layer exposed on the lateral edges. Then at this period in manufacturing, an external interlaced copper mesh layer 42 is exposed superiorly. The boxes are placed next to each other in a single sheet. The outer plastic layer 12 in the desired shape is molded and placed over the outer copper mesh layer. The outer plastic layer and inner plastic layer are adhered together to cover the external Mu-Metal® layer 40. The device surrounds the substance that generates the electromagnetic field.

The multilayer electromagnetic field shielding system may be embodied in a helmet 10 have a radially extending channels 28 with caps 30.

As used in this application, the term "about" or "approximately" refers to a range of values within plus or minus 10% of the specified number. And the term "substantially" refers to up to 80% or more of an entirety. Recitation of ranges of values herein are not intended to be limiting, referring instead individually to any and all values falling within the range, unless otherwise indicated, and each separate value within such a range is incorporated into the specification as if it were individually recited herein.

For purposes of this disclosure, the term "aligned" means parallel, substantially parallel, or forming an angle of less than 35.0 degrees. For purposes of this disclosure, the term "transverse" means perpendicular, substantially perpendicular, or forming an angle between 55.0 and 125.0 degrees. Also, for purposes of this disclosure, the term "length" means the longest dimension of an object. Also, for purposes of this disclosure, the term "width" means the dimension of an object from side to side. For the purposes of this disclosure, the term "above" generally means superjacent, substantially superjacent, or higher than another object although not directly overlying the object. Further, for purposes of this disclosure, the term "mechanical communication" generally refers to components being in direct physical contact with each other or being in indirect physical contact with each other where movement of one component affect the position of the other.

The use of any and all examples, or exemplary language ("e.g.," "such as," or the like) provided herein, is intended merely to better illuminate the embodiments and does not pose a limitation on the scope of the embodiments or the claims. No language in the specification should be construed as indicating any unclaimed element as essential to the practice of the disclosed embodiments.

In the following description, it is understood that terms such as "first," "second," "top," "bottom," "up," "down," and the like, are words of convenience and are not to be construed as limiting terms unless specifically stated to the contrary.

It should be understood, of course, that the foregoing relates to exemplary embodiments of the invention and that modifications may be made without departing from the spirit and scope of the present invention.

What is claimed is:

1. A multilayer electromagnetic field shield system, the system comprising:
   two electromagnetic shield stacks spaced apart by an airgap, wherein each electromagnetic shield stack comprises an electric field attenuator layer adhered to a magnetic field attenuator layer, wherein air gap is directly bounded by a respective magnetic field attenuator layer of the two electromagnetic shield stacks, wherein each electromagnetic shield stack further comprises an outermost electromagnetically inert layer and wherein each electromagnetic shield stack further comprises an innermost electromagnetically inert layer.

2. The system of claim 1, wherein the electric field attenuator layers comprise a copper mesh.

3. The system of claim 2, wherein the magnetic field attenuator layers comprise a MU-metal.

4. The system of claim 3, wherein the airgap is approximately one-half of an inch between its bounds of the respective magnetic field attenuator layers.

5. The system of claim 4, wherein the electromagnetically inert layers are plastic.

6. The system of claim 5, wherein the magnetic field attenuator layers have a thickness of approximately 0.014 of an inch.

7. The system of claim 6, wherein the electric field attenuator layers have a thickness of approximately 0.25 of an inch.

8. The system of claim 7, wherein the outermost electromagnetically inert layer defines an outer surface of a shell with radially protruding channels.

\* \* \* \* \*